(12) United States Patent
Bucher

(10) Patent No.: US 9,668,379 B1
(45) Date of Patent: May 30, 2017

(54) HEAT SPREADER FOR A CAGED ELECTRICAL CONNECTOR ASSEMBLY

(71) Applicant: TYCO ELECTRONICS CORPORATION, Berwyn, PA (US)

(72) Inventor: Alan Weir Bucher, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/098,948

(22) Filed: Apr. 14, 2016

(51) Int. Cl.
*H01R 13/00* (2006.01)
*H05K 7/20* (2006.01)
*H01R 13/514* (2006.01)
*H01R 13/6581* (2011.01)

(52) U.S. Cl.
CPC ....... *H05K 7/20436* (2013.01); *H01R 13/514* (2013.01); *H01R 13/6581* (2013.01)

(58) Field of Classification Search
CPC ............ H05K 7/20436; H01R 13/6581; H01R 13/514

USPC .......................................................... 439/487
See application file for complete search history.

(56) References Cited

U.S. PATENT DOCUMENTS

| 2015/0280368 A1* | 10/2015 | Bucher | H01R 13/665 |
| | | | 439/487 |
| 2016/0211623 A1* | 7/2016 | Sharf | H01R 13/665 |
| | | | 439/487 |

* cited by examiner

*Primary Examiner* — Javaid Nasri

(57) ABSTRACT

A heat spreader includes a front heat spreader having a pluggable module interface configured to be in thermal communication with the pluggable module and a mating interface having first plates spaced apart by first gaps. The heat spreader includes a rear heat spreader having a mating interface including second plates spaced apart by second gaps. The front heat spreader is coupled to the rear heat spreader with the first plates interleaved with the second plates in thermal communication with each other. The first plates are received in the second gaps and the second plates being received in the first gaps. The heat is transferred from the front heat spreader to a heat transfer end of the rear heat spreader for cooling the pluggable module.

20 Claims, 4 Drawing Sheets

US 9,668,379 B1

HEAT SPREADER FOR A CAGED ELECTRICAL CONNECTOR ASSEMBLY

BACKGROUND OF THE INVENTION

The subject matter described herein relates to communication systems.

At least some known communication systems include electrical connector assemblies, such as input/output (I/O) connector assemblies, that are configured to receive a pluggable module and establish a communicative connection between the pluggable module and an electrical connector of the electrical connector assembly. As one example, a known receptacle assembly includes a cage that is mounted to a circuit board and configured to receive a small form-factor (SFP) pluggable transceiver. The receptacle assembly includes an elongated cavity that extends between an opening of the cavity and an electrical connector that is disposed within the cavity and mounted to the circuit board. The pluggable module is inserted through the opening and advanced toward the electrical connector in the cavity. The pluggable module and the electrical connector have respective electrical contacts that engage one another to establish a communicative connection. Conventional communication systems may include multiple cavities and communication connectors for mating with multiple pluggable modules.

Challenges often encountered in the design of the communication system involve dissipating heat generated during operation of the communication system and minimizing electromagnetic interference (EMI), as both heat and EMI negatively affect module/system reliability and electrical performance. Heat dissipation is often accomplished by airflow through the components; however, airflow in some systems may be inadequate, such as due to tight space constraints. Some communication systems utilize heat sinks to dissipate heat from the pluggable modules, however, such heat sinks are typically arranged along the top of the cage and increase the overall size of the communication system, which may be undesirable. Additionally, such heat sinks are typically in direct thermal communication with only the pluggable module in the top port of the cage, leaving the pluggable module in the bottom port of multi-port cages without a direct thermal pathway to the heat sink. Providing effective heat removal from high speed pluggable modules has been problematic.

Accordingly, there is a need to improve heat removal from pluggable modules in caged electrical connector assemblies.

BRIEF DESCRIPTION OF THE INVENTION

In an embodiment, a heat spreader is provided configured to be used in a cage of an electrical connector assembly to transfer heat from a pluggable module. The heat spreader includes a front heat spreader including a main body extending between a front and a rear. The front heat spreader has a pluggable module interface configured to be in thermal communication with the pluggable module to transfer heat from the pluggable module. The front heat spreader has a mating interface at the rear. The mating interface has a plurality of first plates spaced apart by first gaps. The heat spreader includes a rear heat spreader having a mating interface at a front of the rear heat spreader. The mating interface of the rear heat spreader has a plurality of second plates spaced apart by second gaps. The rear heat spreader extends to a heat dissipation end opposite the front. The front heat spreader is coupled to the rear heat spreader with the first plates interleaved with the second plates in thermal communication with each other. The first plates are received in the second gaps and the second plates are received in the first gaps. The heat is transferred from the front heat spreader to the heat dissipation end of the rear heat spreader for cooling the pluggable module.

In another embodiment, an electrical connector assembly is provided including a cage having a plurality of panels defining a module cavity configured to receive a pluggable module therein. The cage extends between a front end and a rear end. The cage has a port to the pluggable cavity open at the front end. The panels are conductive to provide electromagnetic interference (EMI) shielding for the module cavity. The electrical connector assembly includes a communication connector received in the cage proximate to the rear end for electrically connecting to the pluggable module when the pluggable module is plugged into the cage. The electrical connector assembly includes a heat spreader received in the cage for transferring heat from the pluggable module. The heat spreader includes a front heat spreader and a rear heat spreader in thermal communication with the front heat spreader. The front heat spreader is positioned proximate to the front end of the cage. The front heat spreader has a main body extending between a front and a rear. The front heat spreader has a pluggable module interface configured to be in thermal communication with the pluggable module to transfer heat from the pluggable module. The front heat spreader has a mating interface at the rear having a plurality of first plates spaced apart by first gaps. The rear heat spreader is positioned rearward of the front heat spreader and transfers heat therefrom. The rear heat spreader has a mating interface at a front of the rear heat spreader having a plurality of second plates spaced apart by second gaps. The front heat spreader is coupled to the rear heat spreader with the first plates interleaved with the second plates in thermal communication with each other. The first plates are received in the second gaps and the second plates are received in the first gaps. The rear heat spreader extends to a heat dissipation end opposite the front and heat is transferred from the front heat spreader to the heat dissipation end of the rear heat spreader for cooling the pluggable module.

In a further embodiment, an electrical connector assembly is provided including a pluggable module having a pluggable body extending between a mating end and a cable end with an internal circuit board held in the pluggable body and provided at an end of a cable communicatively coupled to the internal circuit board. The electrical connector assembly includes a cage having a plurality of panels defining a module cavity configured to receive a pluggable module therein. The cage extends between a front end and a rear end. The cage has a port to the pluggable cavity open at the front end. The panels are conductive to provide electromagnetic interference (EMI) shielding for the module cavity. The electrical connector assembly includes a communication connector received in the cage proximate to the rear end for electrically connecting to the pluggable module when the pluggable module is plugged into the cage. The electrical connector assembly includes a heat spreader received in the cage for transferring heat from the pluggable module. The heat spreader includes a front heat spreader and a rear heat spreader in thermal communication with the front heat spreader. The front heat spreader is positioned proximate to the front end of the cage. The front heat spreader has a main body extending between a front and a rear. The front heat spreader has a pluggable module interface configured to be in thermal communication with the pluggable module to transfer heat from the pluggable module. The front heat spreader has a mating interface at the rear having a plurality of first plates spaced apart by first gaps. The rear heat spreader is positioned rearward of the front heat spreader and transfers heat therefrom. The rear heat spreader has a mating interface at a front of the rear heat spreader having a plurality of second plates spaced apart by second gaps. The front heat spreader is coupled to the rear heat spreader with the first plates interleaved with the second plates in thermal communication with each other. The first plates are received in the second gaps and the second plates are received in the first gaps. The rear heat spreader extends to a heat dissipation end opposite the front and heat is transferred from the front heat spreader to the heat dissipation end of the rear heat spreader for cooling the pluggable module.

DETAILED DESCRIPTION OF THE INVENTION

Embodiments set forth herein include communication systems providing electromagnetic interference (EMI) shielding and significant thermal transfer for the components thereof. Various embodiments of the communication system provide EMI shielding at the interface between pluggable modules and corresponding communication connectors. Various embodiments of the communication system provide a heat spreader in a cage for transferring heat from a pluggable module received therein.

Figure 1:
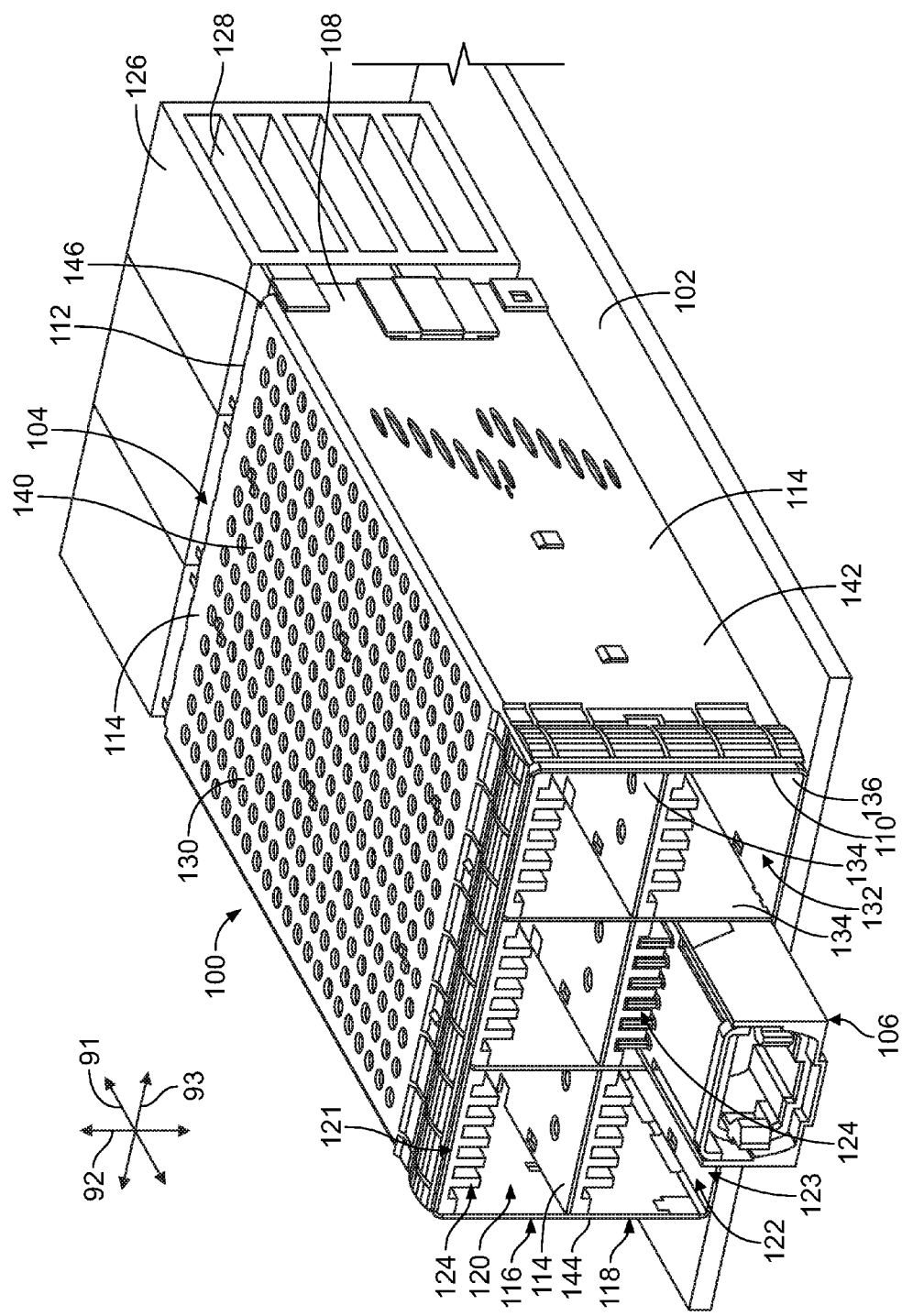
FIG. 1 is a perspective view of a communication system in accordance with an embodiment.

FIG. 1 is a perspective view of a communication system 100 in accordance with an embodiment. The communication system 100 may include a circuit board 102, an electrical connector assembly 104, such as a receptacle assembly, mounted to the circuit board 102, and one or more pluggable modules 106 that are configured to communicatively engage the electrical connector assembly 104. The communication system 100 is oriented with respect to a mating or insertion axis 91, an elevation axis 92, and a lateral axis 93. The axes 91-93 are mutually perpendicular. Although the elevation axis 92 appears to extend in a vertical direction parallel to gravity in FIG. 1, it is understood that the axes 91-93 are not required to have any particular orientation with respect to gravity. Moreover, only one pluggable module 106 is shown in FIG. 1, but it is understood that multiple pluggable modules 106 may simultaneously engage the electrical connector assembly 104.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The electrical connector assembly 104 includes a receptacle housing or cage 108 that is mounted to the circuit board 102. The cage 108 may be arranged at a bezel or faceplate (not shown) of a chassis of the system or device, such as through an opening in the faceplate. As such, the cage 108 is interior of the device and corresponding faceplate and the pluggable module(s) 106 is loaded into the cage 108 from the outside or exterior of the device and corresponding faceplate. When the electrical connector assembly 104 is mounted to the circuit board 102, the electrical connector assembly 104 is electrically coupled to the circuit board 102 and, in particular, to ground planes (not shown) within the circuit board 102 to electrically ground the electrical connector assembly 104. As such, the electrical connector assembly 104 may reduce EMI leakage that may negatively affect electrical performance of the communication system 100.

The cage 108 includes a front end 110 and an opposite back end 112. The front end 110 may be provided at, and extend through an opening in, the faceplate. The mating axis 91 may extend between the front and back ends 110, 112. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the electrical connector assembly 104.

The cage 108 is configured to contain or block electromagnetic interference (EMI) and guide the pluggable module(s) 106 during a mating operation. For example, the cage 108 may be formed from a plurality of interconnected sheets or panels 114 that are interconnected with one another to form the cage 108. The panels 114 may be formed from a conductive material, such as sheet metal and/or a polymer having conductive particles. In the illustrated embodiment, the panels 114 are stamped and formed from sheet metal. In some embodiments, the cage 108 is configured to facilitate airflow through the cage 108 to transfer heat (or thermal energy) away from the electrical connector assembly 104 and pluggable module(s) 106. The air may flow from inside the cage 108 (for example, behind the faceplate) to the external environment (for example, forward of the faceplate) or from outside the cage 108 into the interior of the cage 108. Fans or other air moving devices may be used to increase airflow through the cage 108 and over the pluggable module(s) 106. The panels 114 may include openings to allow airflow therethrough. The openings may be sized small enough such that the panels 114 provide effective EMI shielding.

In the illustrated embodiment, the cage 108 includes a first (or upper) row 116 of elongated module cavities 120 and a second (or lower) row 118 of elongated module cavities 122. Each of the module cavities 120, 122 extends between the front and back ends 110, 112. The module cavities 120, 122 have respective openings or ports 121, 123 that are sized and shaped to receive corresponding pluggable modules 106. The module cavities 120, 122 may have the same or similar dimensions and extend lengthwise in a direction that is parallel to the mating axis 91. In the illustrated embodiment, each upper module cavity 120 is stacked over a corresponding lower module cavity 122 such that the lower module cavity 122 is positioned between the upper module cavity 120 and the circuit board 102. In an exemplary embodiment, the module cavities 120, 122 are arranged in a plurality of columns. Any number of module cavities may be provided including a single row and/or a single column of module cavities.

The panels 114 of the cage 108 may form separator plates between the module cavities 120, 122. The separator plates may extend generally parallel to the mating axis 91 at least partially between the front end 110 and the back end 112. In an exemplary embodiment, the module cavities 120, 122 include heat spreaders 124 therein configured to thermally engage and transfer heat from the pluggable modules 106. In the illustrated embodiment, the heat spreaders 124 extend along top surfaces of the pluggable modules 106 to enhance heat transfer from the pluggable modules 106 located in the module cavities 120, 122; however the heat spreaders 124 may be located elsewhere in the module cavities 120, 122 to transfer heat from other areas of the pluggable modules 106.

In an exemplary embodiment, the heat spreaders 124 transfer heat to an exterior of the cage 108, such as to a heat sink block 126 behind the cage 108. The heat sink block 126 may have fins 128 to provide efficient heat dissipation. For example, an active airflow device, such as a fan, may blow air over the fins 128 of the heat sink block 126 to cool the heat sink block 126. The heat spreaders 124 may be directly thermally coupled to the heat sink block 126. In other various embodiments, one portion of the heat spreaders 124 may be integral with the heat sink block 126 such that no interface is provided therebetween. The heat sink block 126, in such embodiments, defines an external portion of one portion of the heat spreader 124. Optionally, multiple heat spreaders 124 may be associated with one heat sink block 126. The heat sink block 126 may be mounted to the circuit board 102 and/or the cage 108. In the illustrated embodiment, the heat sink block 126 is located behind the cage 108; however, the heat sink block 126 may be located at other locations such as above the cage 108 or elsewhere in alternative embodiments.

The cage 108 includes a main panel or shell 130 that surrounds a cavity 132, a plurality of interior panels 134 and a base panel 136. The main panel 130, the interior panels 134, and the base panel 136 may be stamped and formed from sheet metal. The main panel 130, the interior panels 134, and the base panel 136 are assembled to form the module cavities 120, 122. In an exemplary embodiment, the main panel 130 includes a top panel 140, side panels 142, 144, and a back panel 146 formed integral with each other; however, any of such panels may be separate and coupled to the other panels. The interior panels 134 are positioned within the cavity 132. The interior panels 134 partition or divide the cavity 132 into the separate module cavities 120, 122. The heat spreaders 124 may be coupled to corresponding panels 114, such as the interior panels 134, the top panel 140, the side panels 142, 144, the back panel 136, and the like.

The pluggable module 106 is an input/output (I/O) module configured to be inserted into and removed from the electrical connector assembly 104. The pluggable module 106 is configured to be inserted into one of the module cavities 120, 122 of the cage 108 and advanced in a mating direction along the mating axis 91 to mate with a communication connector housed within the cage 108. The pluggable module 106 may directly engage the corresponding heat spreader 124 to enhance heat transfer from the pluggable module 106 when in use. In some embodiments, the pluggable module 106 is a small form-factor pluggable (SFP) transceiver or quad small form-factor pluggable (QSFP) transceiver. The pluggable module 106 may satisfy certain technical specifications for SFP or QSFP transceivers, such as Small-Form Factor (SFF)-8431. In some embodiments, the pluggable module 106 is configured to transmit data signals up to 2.5 gigabits per second (Gbps), up to 5.0 Gbps, up to 10.0 Gbps, or more. By way of example, the electrical connector assembly 104 and the pluggable module 106 may be similar to the receptacle cages and transceivers, respectively, which are part of the SFP+ product family available from TE Connectivity.

Figure 2:
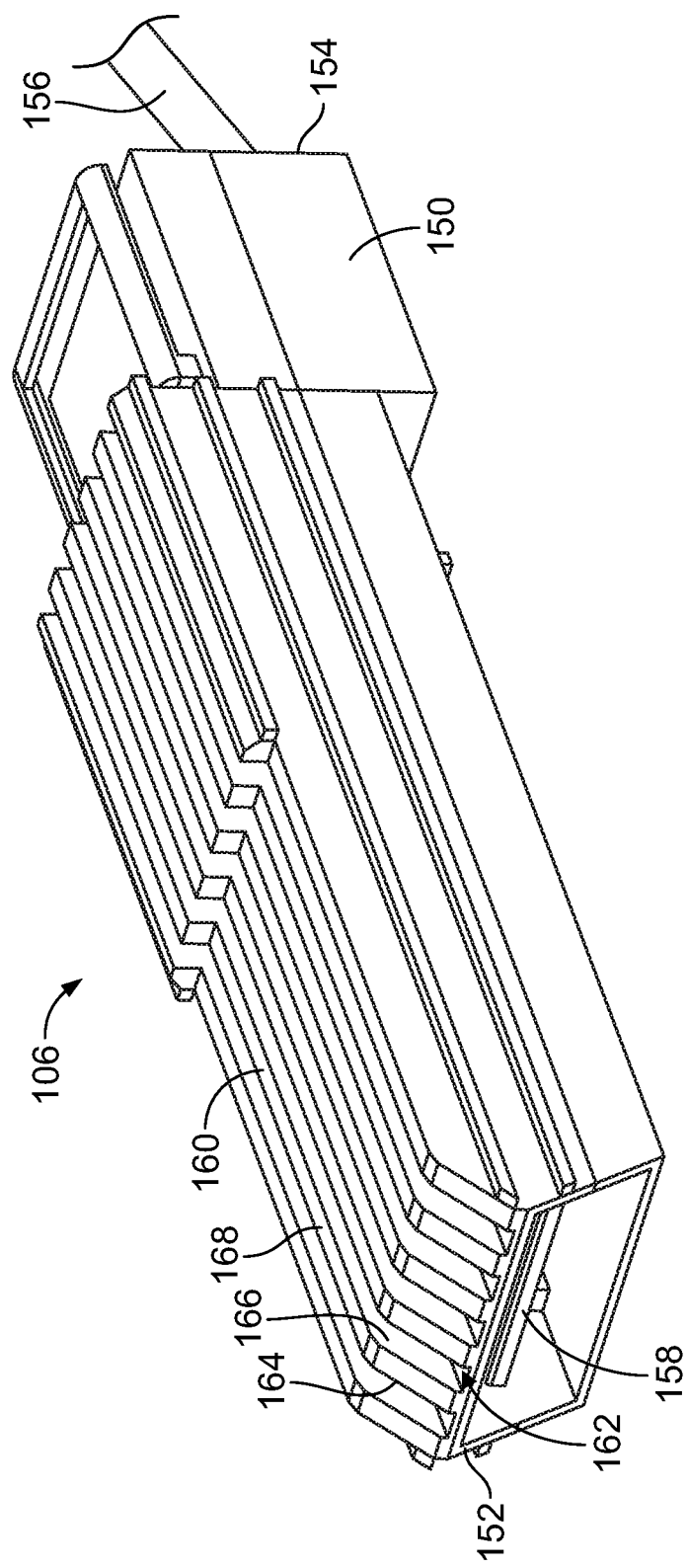
FIG. 2 is a perspective view of a pluggable module of the communication system in accordance with an exemplary embodiment.

FIG. 2 is a perspective view of the pluggable module 106 in accordance with an exemplary embodiment. In some embodiments, the pluggable module 106 is an input/output cable assembly having a pluggable body 150. The pluggable body 150 includes a mating end 152 and an opposite cable end 154. A cable 156 is coupled to the pluggable body 150 at the cable end 154. The pluggable module 106 includes an internal circuit board 158 that is communicatively coupled to electrical wires or optical fibers (not shown) of the cable 156. The internal circuit board 158 may be exposed at the mating end 152 for mating with a communication connector of the electrical connector assembly 104 (shown in FIG. 1). The cable 156 may be communicatively coupled by directly terminating the electrical wires to the internal circuit board 158, such as by soldering the electrical wires to the internal circuit board. Alternatively, the cable 156 may be communicatively coupled by other processes, such as by using connectors at the end of the cable 156 and on the internal circuit board 158. The internal circuit board 158 is supported by the pluggable body 150.

In an exemplary embodiment, the pluggable body 150 is manufactured from a conductive material, such as a metal material. The pluggable body 150 provides EMI shielding for the circuit board 158. Optionally, the pluggable body 150 may provide heat transfer for the internal circuit board 158, such as for the electronic components on the internal circuit board 158. For example, the internal circuit board 158 is in thermal communication with the pluggable body 150 and the pluggable body 150 transfers heat from the internal circuit board 158.

In an exemplary embodiment, the pluggable body 150 includes a plurality of heat transfer fins 160 extending therefrom. The fins 160 increase the surface area of the pluggable body 150 and allow greater heat transfer therefrom. The fins 160 may extend from any portion of the pluggable body 150, such as the top, the sides and/or the bottom. In the illustrated embodiment, the fins 160 are parallel plates with channels 162 therebetween. The fins 160 have sides 164, 166 extending to outer edges 168. The sides 164, 166 may be tapered. The sides 164, 166 may extend continuously between opposite front and rear ends of the fins 160. In alternative embodiments, other types of fins 160 may be used.

Figure 3:
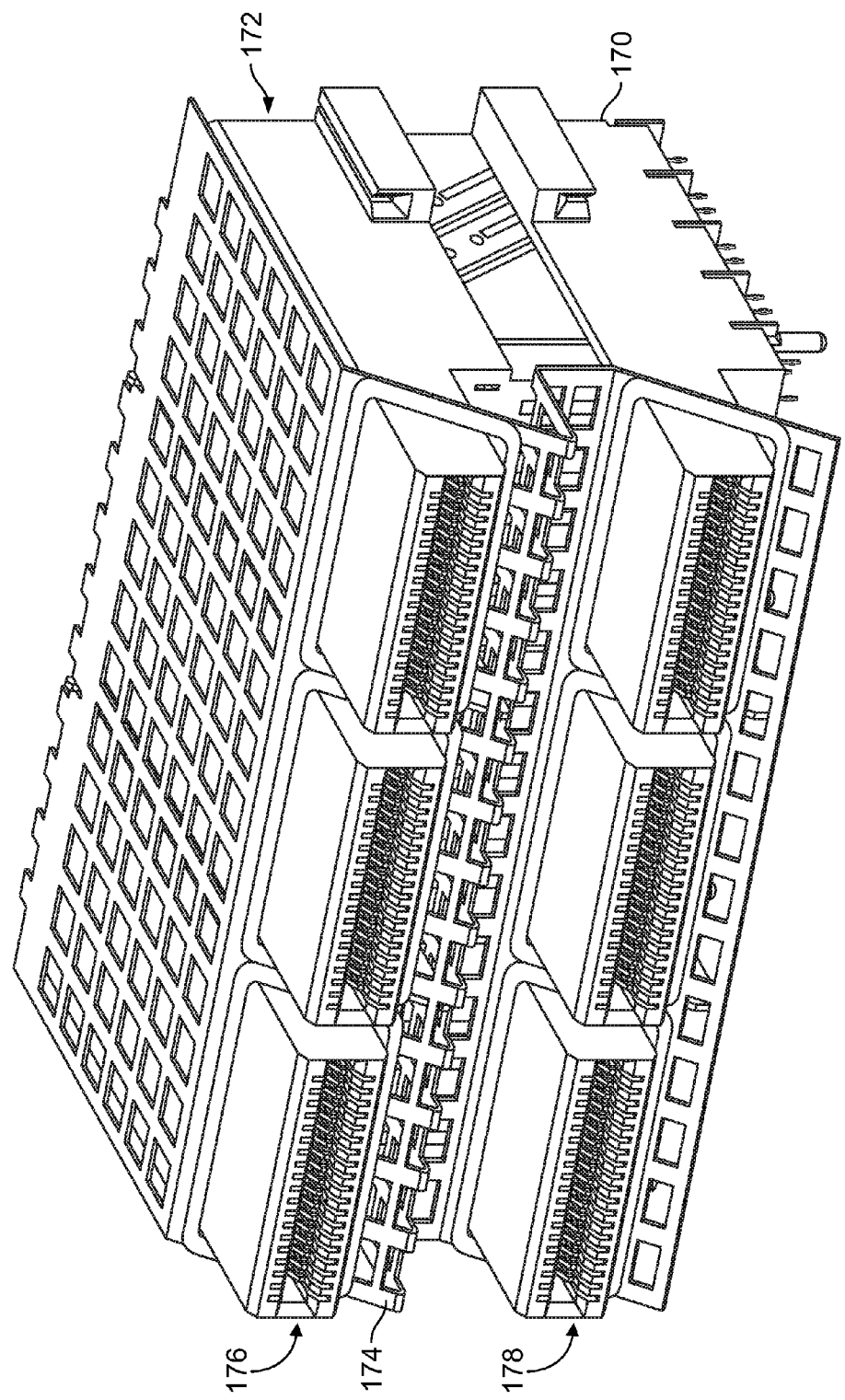
FIG. 3 is a front perspective view of a communication connector of the communication system in accordance with an exemplary embodiment.

FIG. 3 is a front perspective view of a plurality of communication connectors 170, which may be ganged together to form a communication module 172. The communication module 172 may have one or more panels 174 providing EMI shielding for the communication connectors 170. The communication connectors 170 are configured to be received in the cage 108 (shown in FIG. 1). The communication connectors 170 may be individually positioned in the cage 108 or may be loaded into the cage 108 as a unit. The communication connectors 170 are configured to interface with the pluggable modules 106 (shown in FIG. 2) when the pluggable modules 106 are loaded in the cage 108.

In an exemplary embodiment, each communication connector 170 has first and second mating interfaces 176, 178 for interfacing with different pluggable modules 106; however the communication connectors 170 may include a single mating interface or more than two mating interfaces in alternative embodiments. The first mating interface 176 is configured to be disposed within the upper module cavity 120 (shown in FIG. 1), and the second mating interface 178 is configured to be disposed within the lower module cavity 122 (shown in FIG. 1).

Figures 4, 5:
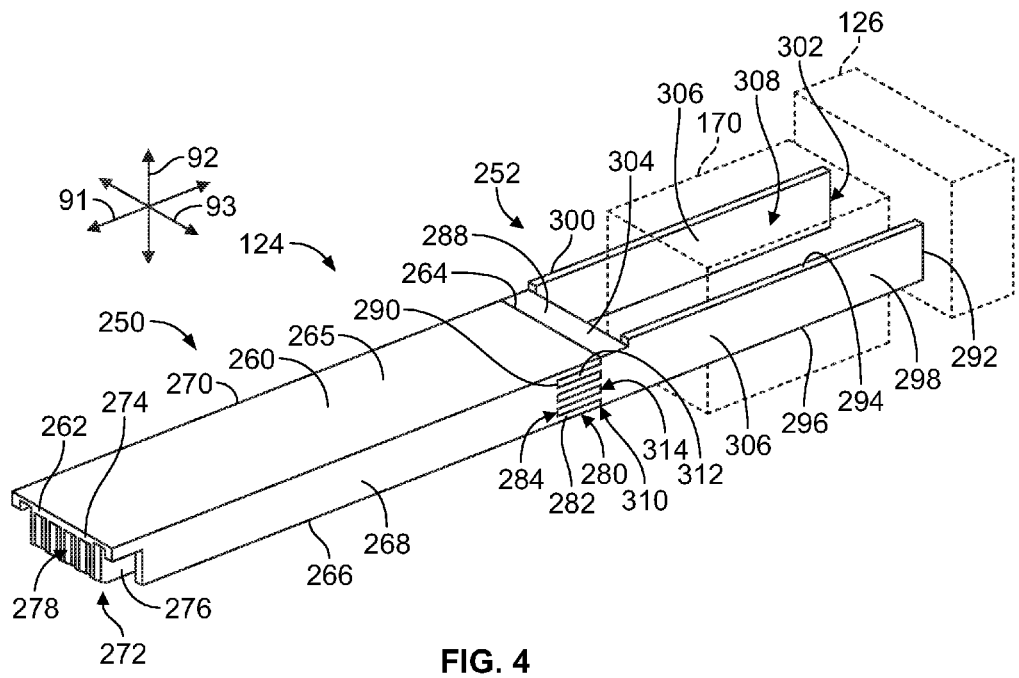
FIG. 4 is a perspective view of a heat spreader of the communication system in accordance with an exemplary embodiment.
FIG. 5 is a perspective view of a heat spreader of the communication system in accordance with an exemplary embodiment.

FIG. 4 is a perspective view of the heat spreader 124 in accordance with an exemplary embodiment. The heat spreader 124 includes a front heat spreader 250 and a rear heat spreader 252. The front and rear heat spreaders 250, 252 are thermally coupled to transfer heat therebetween. The front heat spreader 250 is configured to interface with the pluggable module 106 to transfer heat from the pluggable module 106. The rear heat spreader 252 is configured to transfer heat into the heat sink block 126 (shown schematically in FIG. 4) to dissipate heat from the heat spreader 124. In an exemplary embodiment, the front and rear heat spreaders 250, 252 are variably positionable allowing relative floating movement therebetween. The amount of floating movement between the heat spreaders 250, 252 may accommodate misalignment or realignment of the front and rear heat spreaders 250, 252, such as for aligning the front heat spreader 250 to the pluggable module 106 while aligning the rear heat spreader 252 to the heat sink block 126, the cage 108, the communication connector 170 (shown schematically in FIG. 4), or to another structure.

The front heat spreader 250 includes a main body 260 extending between a front 262 and a rear 264. The front heat spreader 250 includes a top 265, a bottom 266 and opposite sides 268, 270. The front heat spreader 250 has a pluggable module interface 272 configured to be in thermal communication with the pluggable module 106 to transfer heat from the pluggable module 106. The front heat spreader 250 includes a base 274 extending generally between the front 262 and the rear 264. The base 274 may be provided at or near the top 265, such as in the illustrated embodiment. The base 274 may form part of the pluggable module interface 272. Optionally, the base 274 may directly engage the pluggable module 106. For example, the outer edges 168 of the heat transfer fins 160 (both shown in FIG. 2) may engage the underside of the base 274.

In an exemplary embodiment, the front heat spreader 250 includes a plurality of heat ribs 276 extending from the main body 260, such as from the bottom of the base 274. The heat ribs 276 extend at least partially between the front 262 and the rear 264. Optionally the length of the heat ribs 276 may correspond to the length of the pluggable module 106 and/or the length of the heat transfer fins 160. The heat ribs 276 have slots 278 defined between the heat ribs 276. The heat ribs 276 define a portion of the pluggable module interface 272 configured to be in thermal communication with the pluggable module 106. For example, the heat ribs 276 are configured to be positioned in the channels 162 between the heat transfer fins 160. The slots 278 receive corresponding heat transfer fins 160 such that the heat ribs 276 are adjacent and in thermal communication with corresponding heat transfer fins 160. Optionally, the heat transfer fins 160 may substantially fill the slots 278 and the heat ribs 276 may substantially fill the channels 162 to ensure close thermal coupling between the pluggable module 106 and the front heat spreader 250. Optionally, outer edges of the heat ribs 276 may engage the pluggable body 150 of the pluggable module 106 and/or the outer edges 168 of the heat transfer fins 160 may engage the base 274. The heat ribs 276 may be tapered. The heat ribs 276 at the front 262 may be chamfered to provide a lead-in to the slots 278.

The front heat spreader 250 has a mating interface 280 at the rear 264 for interfacing with the rear heat spreader 252. In an exemplary embodiment, the mating interface 280 has a plurality of first plates 282 spaced apart by first gaps 284. The plates 282 are received in corresponding portions of the rear heat spreader 252 to provide a thermal interface therebetween. The first plates 282 provide an area of increased surface area for heat transfer to the rear heat spreader 252. Any number of the plates 282 may be provided. The plates 282 may be generally planar, parallel plates. In the illustrated embodiment, the plates 282 are oriented horizontally; however other orientations are possible in alternative embodiments. Optionally, the plates 282 may extend the entire width of the front heat spreader 250 and are open at the sides 268, 270, such as to allow side-to-side movement of the front heat spreader 250 relative to the rear heat spreader 252. Optionally, the plates 282 may be integral with the base 274 and/or the heat ribs 276 to provide efficient heat transfer from the pluggable module 106 to the rear heat spreader 252.

In an exemplary embodiment, the front heat spreader 250 is a single piece of thermally conductive material, such as metal material; however, the front heat spreader 250 may be multiple pieces in alternative embodiments, such as including an adapter at the mating interface for interfacing with the rear heat spreader 252, such as to allow relative floating movement between the front and rear heat spreaders 250, 252.

The rear heat spreader 252 includes a main body 288 extending between a front 290 and a rear 292. The rear heat spreader 252 includes a top 294, a bottom 296 and opposite sides 298, 300. The rear heat spreader 252 has a heat dissipation end 302 at the rear 292 in thermal communication with the heat sink block 126 (and may be integral with the heat sink block 126 at the rear 292) to transfer heat from the front heat spreader 250 to the heat sink block 126. The rear heat spreader 252 includes a base 304 at the front 292.

In an exemplary embodiment, the rear heat spreader 252 includes a plurality of heat rails 306 extending rearward from the base 304 to the heat dissipation end 302. The heat rails 306 have a pocket 308 therebetween sized and shaped to receive the communication connector 170 (shown in FIG. 3). The heat rails 306 are configured to pass on opposite sides of the communication connector 170 to the rear end 112 of the cage 108 (both shown in FIG. 1). As such, the heat rails 306 are able to exit the cage 108 and extend to the heat sink block 126. The heat rails 306 transfer the heat from forward of the communication connector 170 (for example, from the pluggable module 106) to rearward of the communication connector 170 (for example, to the heat sink block 126). The heat rails 306 are relatively thin so as to not detrimentally affect the overall width of the electrical connector assembly 104.

The rear heat spreader 252 has a mating interface 310 at the front 290 for interfacing with the mating interface 280 of the front heat spreader 250. In an exemplary embodiment, the mating interface 310 has a plurality of second plates 312 spaced apart by second gaps 314. The second plates 312 are configured to internest with the first plates 282 to provide a thermal interface therebetween. In an exemplary embodiment, the front heat spreader 250 is coupled to the rear heat spreader 252 with the first plates 282 interleaved with the second plates 312 in thermal communication with each other. Optionally, thermal grease or other thermal interface material may be provided between the plates 282, 312 to enhance the thermal transfer at the thermal interface. The first plates 282 are received in the second gaps 314 and the second plates 312 are received in the first gaps 284. Heat is transferred from the front heat spreader 250 through the thermal interface to the heat dissipation end 302 of the rear heat spreader 252, and thus to the heat sink block 126, for cooling the pluggable module 106.

The second plates 312 provide an area of increased surface area for heat transfer with the front heat spreader 250. Any number of the plates 312 may be provided. The plates 312 may be generally planar, parallel plates. In the illustrated embodiment, the plates 312 are oriented horizontally; however, other orientations are possible in alternative embodiments. Optionally, the plates 312 may extend the entire width of the rear heat spreader 252 and are open at the sides 298, 300, such as to allow side-to-side movement of the front heat spreader 250 relative to the rear heat spreader 252, or vice versa. Optionally, the plates 312 may be integral with the base 304 and/or the heat rails 306 to provide efficient heat transfer from the front heat spreader 250 to the heat sink block 126.

In an exemplary embodiment, the rear heat spreader 252 is a single piece of thermally conductive material, such as metal material; however, the rear heat spreader 252 may be multiple pieces in alternative embodiments, such as including an adapter at the mating interface 310 for interfacing with the front heat spreader 250, such as to allow relative floating movement between the front and rear heat spreaders 250, 252.

The mating interfaces 280, 310 of the heat spreaders 250, 252 allow relative movement therebetween to accommodate alignment of the heat spreaders 250, 252, such as with the pluggable module 106 and/or the cage 108. For example, as the pluggable module 106 is loaded into the cage 108, the pluggable module 106 ultimately mates with the communication connector 170. Because the front heat spreader 250 is tied to the pluggable module 106 due to the intermeshing of the heat transfer fins 160 and the heat ribs 276, when the pluggable module 106 needs to shift laterally side-to-side for proper alignment with the communication connector 170, the front heat spreader 250 must also shift laterally with the pluggable module 106. As such, the front heat spreader 250 will not resist lateral alignment of the pluggable module 106 with the communication connector 170.

In an exemplary embodiment, the first and second plates 282, 312 are interleaved to allow a limited amount of floating movement between the front and rear heat spreaders 250, 252 in at least two mutually perpendicular directions. For example, in the illustrated embodiment, the heat spreaders 250, 252 are allowed to move in a horizontal plane. The first and second plates 282, 312 are oriented horizontally allowing relative movement in the horizontal plane. The gaps 284, 314 receive the plates 312, 282 to allow front-to-back movement of the front heat spreader 250 and/or the rear heat spreader 252 in a direction generally parallel to the mating axis 91 and to allow side-to-side movement of the front heat spreader 250 and/or the rear heat spreader 252 in a direction generally parallel to the lateral axis 93. The plates 282, 312 restrict movement in a direction generally parallel to the elevation axis 92. Optionally, the heat dissipation end 302 of the rear heat spreader 252 may be fixed relative to the cage 108, such as to the heat sink block 126. Optionally, the heat rails 306 may be fixed relative to the cage 108 and/or the communication connector 170 because the communication connector 170, which is fixed to the circuit board 102, is positioned in the pocket 308. As such, the rear heat spreader 252 may be fixed in position within the cage 108. The front heat spreader 250 may be movable relative to the rear heat spreader 252 to accommodate alignment to the pluggable module 106.

FIG. 5 is a perspective view of a heat spreader 350 in accordance with an exemplary embodiment. The heat spreader 350 includes the front heat spreader 250 and a rear heat spreader 352 formed in accordance with an exemplary embodiment. The rear heat spreader is a multi-piece part. The rear heat spreader 352 includes a main rear heat spreader 354 at a rear 355 of the rear heat spreader 352, and a float adapter 356 at a front 358 of the rear heat spreader 352 being thermally coupled to the main rear heat spreader 354. The float adapter 356 is provided between the front heat spreader 250 and the main rear heat spreader 354. The float adapter 356 allows relative movement in three mutually perpendicular directions as opposed to only two perpendicular directions. For example, the float adapter 356 allows movement in a direction parallel to the elevation axis 92 (for example, up-and-down) in addition to movement in directions parallel to the mating axis 91 and the lateral axis 93. The amount of floating movement (for example, up-and-down, side-to-side and front-to-back) between the heat spreaders 250, 352 may accommodate alignment of the front and rear heat spreaders 250, 352, such as for aligning the front heat spreader 250 and the pluggable module 106 to the rear heat spreader 352 and the communication connector 170 (shown in FIG. 3).

In an exemplary embodiment, the float adapter 356 is a single piece of thermally conductive material, such as metal material. The float adapter 356 includes a main body 360 having a top 364, a bottom 366 and opposite sides 368, 370. The float adapter 356 has a front mating interface 372 configured to be in thermal communication with the mating interface 280 of the front heat spreader 250. In an exemplary embodiment, the front mating interface 372 has a plurality of second plates 374 spaced apart by second gaps 376. The second plates 374 may be similar to the second plates 312 (shown in FIG. 4) and the second gaps 376 may be similar to the second gaps 314. The second plates 374 are received in the first gaps 284 of the front heat spreader 250. The second gaps 376 receive the first plates 282 to provide a thermal interface therebetween. In the illustrated embodiment, the plates 374 are oriented horizontally; however other orientations are possible in alternative embodiments.

The float adapter 356 has a rear mating interface 380 for interfacing with the main rear heat spreader 354. In an exemplary embodiment, the rear mating interface 380 has a plurality of third plates 382 spaced apart by third gaps 384. The third plates 382 provide an area of increased surface area for heat transfer to the main rear heat spreader 354. In the illustrated embodiment, the third plates 382 are oriented vertically; however other orientations are possible in alternative embodiments. Optionally, the third plates 382 may extend the entire height of the float adapter 356 and are open at the top 364 and the bottom 366, such as to allow vertical, up-and-down movement of the float adapter 356 relative to the main rear heat spreader 354.

The main rear heat spreader 354 includes a main body 390 extending between a front 392 and a rear 394, which may define the rear 355 of the rear heat spreader 352. The main rear heat spreader 354 includes a top 395, a bottom 396 and opposite sides 398, 400. The main rear heat spreader 354 has a heat dissipation end 402 at the rear 394 in thermal communication with the heat sink block 126 (shown in FIG.

4), and may be integral with the heat sink block 126 at the rear 394, to transfer heat from the front heat spreader 250 and the float adapter 356 to the heat sink block 126. The main rear heat spreader 354 includes a base 404 at the front 392.

In an exemplary embodiment, the main rear heat spreader 354 includes a plurality of heat rails 406 extending rearward from the base 404 to the heat dissipation end 402. The heat rails 406 may be similar to the heat rails 306 (shown in FIG. 3). The heat rails 406 have a pocket 408 therebetween sized and shaped to receive the communication connector 170 (shown in FIG. 3).

The main rear heat spreader 354 has a mating interface 410 at the front 392 for interfacing with the rear mating interface 380 of the float adapter 356. In an exemplary embodiment, the mating interface 410 has a plurality of fourth plates 412 spaced apart by fourth gaps 414. In the illustrated embodiment, the plates 412 are oriented vertically; however other orientations are possible in alternative embodiments. The fourth plates 412 are configured to internest with the third plates 382 of the float adapter 356 to provide a thermal interface therebetween. In an exemplary embodiment, the float adapter 356 is coupled to the main rear heat spreader 354 with the third plates 382 interleaved with the fourth plates 412 in thermal communication with each other. Optionally, thermal grease or other thermal interface material may be provided between the third and fourth plates 382, 412 to enhance the thermal transfer at the thermal interface. The third plates 382 are received in the fourth gaps 414 and the fourth plates 412 are received in the third gaps 384. Heat is transferred from the float adapter 356 through the thermal interface to the heat dissipation end 402 of the main rear heat spreader 354, and thus to the heat sink block 126, for cooling the pluggable module 106.

The mating interfaces 372, 380 of the float adapter 356 allow movement of the front heat spreader 250 relative to the main rear heat spreader 354, such as to accommodate alignment of the pluggable module 106. The first and second plates 282, 374 are oriented perpendicular to the third and fourth plates 382, 412 to allow movement in different directions, such as in horizontal and vertical planes. The front heat spreader 250 is able to shift front-to-back, to shift laterally side-to-side, and to shift vertically for proper alignment of the pluggable module 106 with the communication connector 170. The front heat spreader 250 has a limited amount of floating movement in a horizontal plane relative to the float adapter 356. The float adapter 356 has a limited amount of floating movement in a vertical plane relative to the main rear heat spreader 354.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A heat spreader configured to be used in a cage of an electrical connector assembly, the heat spreader comprising:
   a front heat spreader including a main body extending between a front and a rear, the front heat spreader having a pluggable module interface configured to be in thermal communication with a pluggable module to transfer heat from the pluggable module, the front heat spreader having a mating interface at the rear, the mating interface having a plurality of first plates spaced apart by first gaps; and
   a rear heat spreader having a mating interface at a front of the rear heat spreader, the mating interface of the rear heat spreader having a plurality of second plates spaced apart by second gaps, the rear heat spreader extending to a heat dissipation end opposite the front;
   wherein the front heat spreader is coupled to the rear heat spreader with the first plates interleaved with the second plates in thermal communication with each other, the first plates being received in the second gaps and the second plates being received in the first gaps, the heat being transferred from the front heat spreader to the heat dissipation end of the rear heat spreader for cooling the pluggable module.

2. The heat spreader of claim 1, wherein the mating interfaces of the front and rear heat spreaders allow relative movement therebetween to accommodate alignment of the front and rear heat spreaders.

3. The heat spreader of claim 1, wherein the first and second plates are interleaved to allow a limited amount of floating movement between the front and rear heat spreaders in at least two mutually perpendicular directions.

4. The heat spreader of claim 1, wherein the first and second plates are oriented horizontally allowing relative movement in a horizontal plane.

5. The heat spreader of claim 1, wherein the front heat spreader includes a top, a bottom, and opposite first and second sides between the front and the rear, the second gaps receiving the first plates to allow front-to-back movement of the front heat spreader relative to the rear heat spreader and to allow side-to-side movement of the front heat spreader relative to the rear heat spreader.

6. The heat spreader of claim 1, wherein the heat dissipation end of the rear heat spreader is fixed relative to the cage, the front heat spreader being movable relative to the heat dissipation end of the rear heat spreader to accommodate alignment to the pluggable module as the pluggable module is loaded into the cage and mated to a communication connector in the cage.

7. The heat spreader of claim 1, wherein the front heat spreader includes a plurality of heat ribs extending from the main body at least partially between the front and the rear with slots defined between the heat ribs, the ribs defining the pluggable module interfaces configured to be in thermal communication with the pluggable module.

8. The heat spreader of claim 7, wherein the heat ribs are configured to be positioned between and directly engage heat transfer fins extending from the pluggable module, the slots being configured to receive the heat transfer fins, the heat ribs transferring heat into a base and into the rear heat spreader through the first plates.

9. The heat spreader of claim 1, wherein the rear heat spreader includes heat rails extending to the heat dissipation end, the heat rails having a pocket therebetween sized and shaped to receive a communication connector configured to be electrically connected to the pluggable module, the heat rails configured to pass on opposite sides of the communication connector to a rear end of the cage.

10. The heat spreader of claim 1, wherein the rear heat spreader includes a main rear heat spreader at a rear of the rear heat spreader and a float adapter at the front of the rear heat spreader, the float adapter having the second plates, the float adapter having a limited amount of floating movement relative to the main rear heat spreader.

11. The heat spreader of claim 10, wherein the float adapter includes third plates opposite the second plates being spaced apart by third gaps and the main rear heat spreader includes fourth plates spaced apart by fourth gaps, the float adapter being coupled to the main rear heat spreader with the third plates interleaved with the fourth plates in thermal communication with each other, the third plates being received in the fourth gaps and the fourth plates being received in the third gaps.

12. The heat spreader of claim 11, wherein the first and second plates are oriented perpendicular to the third and fourth plates.

13. The heat spreader of claim 11, wherein the first and second plates allow movement in a horizontal plane and the third and fourth plates allow movement in a vertical plane.

14. An electrical connector assembly comprising:
a cage having a plurality of panels defining a module cavity configured to receive a pluggable module therein, the cage extending between a front end and a rear end, the cage having a port to the pluggable cavity open at the front end, the panels being conductive to provide electromagnetic interference (EMI) shielding for the module cavity;
a communication connector received in the cage proximate to the rear end for electrically connecting to the pluggable module when the pluggable module is plugged into the cage; and
a heat spreader received in the cage, the heat spreader comprising a front heat spreader and a rear heat spreader in thermal communication with the front heat spreader, the front heat spreader being positioned proximate to the front end of the cage, the front heat spreader having a main body extending between a front and a rear, the front heat spreader having a pluggable module interface configured to be in thermal communication with the pluggable module to transfer heat from the pluggable module, the front heat spreader having a mating interface at the rear, the mating interface having a plurality of first plates spaced apart by first gaps, the rear heat spreader positioned rearward of the front heat spreader and transferring heat therefrom, the rear heat spreader having a mating interface at a front of the rear heat spreader, the mating interface of the rear heat spreader having a plurality of second plates spaced apart by second gaps, wherein the front heat spreader is coupled to the rear heat spreader with the first plates interleaved with the second plates in thermal communication with each other, the first plates being received in the second gaps and the second plates being received in the first gaps, the rear heat spreader extending to a heat dissipation end opposite the front and heat being transferred from the front heat spreader to the heat dissipation end of the rear heat spreader for cooling the pluggable module.

15. The electrical connector assembly of claim 14, wherein the mating interfaces of the front and rear heat spreaders allow relative movement therebetween to accommodate alignment of the front and rear heat spreaders for mating the pluggable module with the communication connector.

16. The electrical connector assembly of claim 14, wherein the first and second plates are interleaved to allow a limited amount of floating movement between the front and rear heat spreaders in at least two mutually perpendicular directions.

17. The electrical connector assembly of claim 14, wherein the first and second plates are oriented horizontally allowing relative movement in a horizontal plane.

18. The electrical connector assembly of claim 14, wherein the rear heat spreader includes a main rear heat spreader at a rear of the rear heat spreader and a float adapter at the front of the rear heat spreader, the float adapter having the second plates, the float adapter having third plates opposite the second plates being spaced apart by third gaps and the main rear heat spreader including fourth plates spaced apart by fourth gaps, the float adapter being coupled to the main rear heat spreader with the third plates interleaved with the fourth plates in thermal communication with each other, the third plates being received in the fourth gaps and the fourth plates being received in the third gaps, the float adapter having a limited amount of floating movement relative to the main rear heat spreader.

19. A electrical connector assembly comprising:
a pluggable module having a pluggable body extending between a mating end and a cable end, the pluggable module has an internal circuit board held in the pluggable body and provided at an end of a cable communicatively coupled to the internal circuit board;
a cage having a plurality of panels defining a module cavity configured to receive the pluggable module therein, the cage extending between a front end and a rear end, the cage having a port to the pluggable cavity open at the front end, the panels being conductive to provide electromagnetic interference (EMI) shielding for the module cavity;
a communication connector received in the cage proximate to the rear end for electrically connecting to the pluggable module when the pluggable module is plugged into the cage; and
a heat spreader received in the cage, the heat spreader comprising a front heat spreader and a rear heat spreader in thermal communication with the front heat spreader, the front heat spreader being positioned proximate to the front end of the cage, the front heat spreader having a main body extending between a front and a rear, the front heat spreader having a pluggable module interface in thermal communication with the pluggable module to transfer heat from the pluggable module, the front heat spreader having a mating interface at the rear, the mating interface having a plurality of first plates spaced apart by first gaps, the rear heat spreader positioned rearward of the front heat spreader and transferring heat therefrom, the rear heat spreader having a mating interface at a front of the rear heat spreader, the mating interface of the rear heat spreader having a plurality of second plates spaced apart by second gaps, wherein the front heat spreader is coupled to the rear heat spreader with the first plates interleaved with the second plates in thermal communication with each other, the first plates being received in the second gaps and the second plates being received in the first gaps, the rear heat spreader extending to a heat dissipation end opposite the front and heat being transferred from the front heat spreader to the heat dissipation end of the rear heat spreader for cooling the pluggable module.

20. The electrical connector assembly of claim 19, wherein the pluggable module includes heat transfer fins extending from the pluggable body with channels between the heat transfer fins, the front heat spreader having heat ribs at the pluggable module interface separated by slots, the slots receiving corresponding heat transfer fins, the channels receiving corresponding heat ribs such that the heat ribs are adjacent and in thermal communication with corresponding heat transfer fins.

* * * * *